United States Patent
Brewer et al.

(10) Patent No.: US 12,278,212 B2
(45) Date of Patent: Apr. 15, 2025

(54) REWORKABLE INTER-SUBSTRATE BOND STRUCTURE

(71) Applicant: The Boeing Company, Chicago, IL (US)

(72) Inventors: Peter D. Brewer, Westlake Village, CA (US); John J. Vajo, West Hills, CA (US); Sevag Terterian, Lake Balboa, CA (US); Chia-Ming Chang, Agoura Hills, CA (US); Charbel Abijaoude, Newbury Park, CA (US); Diego Eduardo Carrasco, Los Angeles, CA (US)

(73) Assignee: The Boeing Company, Arlington, VA (US)

( * ) Notice: Subject to any disclaimer, the term of this patent is extended or adjusted under 35 U.S.C. 154(b) by 514 days.

(21) Appl. No.: 17/663,857

(22) Filed: May 18, 2022

(65) Prior Publication Data

US 2023/0378126 A1    Nov. 23, 2023

(51) Int. Cl.
*H01L 23/00* (2006.01)

(52) U.S. Cl.
CPC .............. *H01L 24/98* (2013.01); *H01L 24/05* (2013.01); *H01L 24/08* (2013.01); *H01L 24/80* (2013.01); *H01L 2224/0508* (2013.01); *H01L 2224/05101* (2013.01); *H01L 2224/05117* (2013.01); *H01L 2224/05123* (2013.01); *H01L 2224/05138* (2013.01); *H01L 2224/05164* (2013.01); *H01L 2224/05166* (2013.01); *H01L 2224/0517* (2013.01); *H01L 2224/05172* (2013.01); *H01L 2224/05179* (2013.01); *H01L 2224/05181* (2013.01); *H01L 2224/05565* (2013.01); *H01L 2224/08145* (2013.01); *H01L 2224/8012* (2013.01); *H01L 2224/80203* (2013.01); *H01L 2924/01003* (2013.01);
(Continued)

(58) Field of Classification Search
CPC .......... H01L 24/05; H01L 24/08; H01L 24/80
See application file for complete search history.

(56) References Cited

U.S. PATENT DOCUMENTS

2023/0378126 A1*  11/2023  Brewer ................... H01L 24/05

OTHER PUBLICATIONS

Manchester, F.D. et al., "Phase Diagrams of Binary Hydrogen Alloys", 2000, p. 158-181, ASM International, Materials Park, Ohio.
(Continued)

*Primary Examiner* — Mark V Prenty
(74) *Attorney, Agent, or Firm* — Alleman Hall & Tuttle LLP

(57) ABSTRACT

An inter-substrate bond structure includes an adhesion layer that attached to a first substrate, and an outer gas-permeable layer coupled to the adhesion layer. The outer gas-permeable layer expands and fractures in response to absorbing a gas. The inter-substrate bond structure includes an outer bond layer coupled to the outer gas-permeable layer. The outer bond layer forms an initial thermocompression bond with a mating layer on a second substrate. The initial thermocompression bond bonds the first substrate to the second substrate with the inter-substrate bond structure. The fracture in the inter-substrate bond structure debonds the first substrate from the second substrate while leaving a first portion of the inter-substrate bond structure attached to the first substrate.

20 Claims, 11 Drawing Sheets

(52) U.S. Cl.
CPC ............ *H01L 2924/01011* (2013.01); *H01L 2924/01012* (2013.01); *H01L 2924/01021* (2013.01); *H01L 2924/01022* (2013.01); *H01L 2924/01023* (2013.01); *H01L 2924/01039* (2013.01); *H01L 2924/0104* (2013.01); *H01L 2924/01041* (2013.01); *H01L 2924/01046* (2013.01); *H01L 2924/01057* (2013.01); *H01L 2924/01073* (2013.01)

(56) References Cited

OTHER PUBLICATIONS

Kuriiwa et al., "Effects of V content on hydrogen storage properties of VeTieCr alloys with high desorption pressure", Jul. 21, 2010, p. 9083-9087.
Manchester et al., "H—Ti (Hydrogen-Titanium)", Phase Diagrams of Binary Hydrogen Alloys, p. 238-258, Feb. 1987.
Bowman et al., "Metallic Hydrides I: Hydrogen Storage and Other Gas-Phase Applications", Sep. 2002, p. 688-693.

\* cited by examiner

REWORKABLE INTER-SUBSTRATE BOND STRUCTURE

TECHNICAL FIELD

The disclosure relates generally to flip-chip bonding, and in particular, to a reworkable inter-substrate bond structure.

BACKGROUND

Current computing systems involve dense integrations of a range of different elements, including processors, application specific integrated circuit accelerators, memory devices, high speed input/output devices, network processing devices, and power delivery/power management devices. Three-dimensional integration of the devices provides a performance advancement due to an increase in interconnectivity between constituent elements. The three-dimensional integration involves inter-chip thermocompression bonding. Thermocompression bonding at fine-pitch spacings often involves thermally compressing gold-covered bonding bumps at elevated temperatures and elevated pressures. Melting the gold to debond the chips involves significant heat that risks damaging the chips.

Accordingly, those skilled in the art continue with research and development efforts in the field of making inter-chip thermal bonding reworkable.

SUMMARY

An inter-substrate bond structure is provided herein. The inter-substrate bond structure includes an adhesion layer, an outer gas-permeable layer, and an outer bond layer. The adhesion layer is configured to attach the inter-substrate bond structure to a first substrate. The outer gas-permeable layer is coupled to the adhesion layer. The outer gas-permeable layer is configured to expand and create a fracture in the inter-substrate bond structure in response to an absorption of a gas. The outer bond layer coupled to the outer gas-permeable layer. The outer bond layer is configured to form an initial thermocompression bond with a mating layer on a second substrate in response to an applied pressure and an applied heat. The initial thermocompression bond bonds the first substrate to the second substrate with the inter-substrate bond structure. The fracture in the inter-substrate bond structure debonds the first substrate from the second substrate while leaving a first portion of the inter-substrate bond structure attached to the first substrate.

In one or more embodiments, the inter-substrate bond structure includes an inner bond layer disposed between the adhesion layer and the outer gas-permeable layer. The inner bond layer is configured to form a subsequent thermocompression bond after the outer bond layer and the outer gas-permeable layer are removed from the inter-substrate bond structure.

In one or more embodiments, the inter-substrate bond structure includes an intermediate gas-permeable layer disposed between the outer gas-permeable layer and the inner bond layer. The intermediate gas-permeable layer is configured to expand and create another fracture in the inter-substrate bond structure in response to another absorption of the gas. The intermediate gas-permeable layer absorbs the gas at an intermediate rate. The outer gas-permeable layer absorbs the gas at an outer rate. The intermediate rate is slower than the outer rate. The inter-substrate bond structure further includes an intermediate bond layer disposed between the outer gas-permeable layer and the intermediate gas-permeable layer. The intermediate bond layer is configured to form another thermocompression bond after the outer bond layer and the outer gas-permeable layer are removed from the inter-substrate bond structure.

In one or more embodiments, the inter-substrate bond structure includes an intermediate gateway layer adjoining the intermediate gas-permeable layer. The intermediate gateway layer is configured to transfer the gas from an atmosphere around the inter-substrate bond structure into the intermediate gas-permeable layer.

In one or more embodiments, the inter-substrate bond structure includes an outer gateway layer adjoining the outer gas-permeable layer. The outer gateway layer is configured to transfer the gas from an atmosphere around the inter-substrate bond structure into the outer gas-permeable layer.

In one or more embodiments, the inter-substrate bond structure includes an outer oxide coating formed on an exterior surface of the outer gas-permeable layer. The outer oxide coating blocks the gas from transferring from the atmosphere around the inter-substrate bond structure through the outer oxide coating and into the outer gas-permeable layer.

In one or more embodiments of the inter-substrate bond structure, the outer gateway layer includes palladium, and the gas comprises hydrogen.

In one or more embodiments of the inter-substrate bond structure, the outer gas-permeable layer includes one or more of titanium, titanium alloy, vanadium, niobium, palladium, tantalum, lanthanum, yttrium, zirconium, scandium, lithium, sodium, and magnesium. The gas includes hydrogen.

In one or more embodiments of the inter-substrate bond structure, the first substrate includes one of a semiconductor die, a semiconductor tile, or a semiconductor wafer.

A method for fabricating an inter-substrate bond structure is provided herein. The method includes forming an adhesion layer of the inter-substrate bond structure on a first substrate, and forming an outer gas-permeable layer coupled to the adhesion layer. The outer gas-permeable layer is configured to expand and create a fracture in the inter-substrate bond structure in response to an absorption of a gas. The method includes forming an outer bond layer coupled to the outer gas-permeable layer. The outer bond layer is configured to form an initial thermocompression bond with a mating layer on a second substrate in response to an applied pressure and an applied heat. The initial thermocompression bond bonds the first substrate to the second substrate with the inter-substrate bond structure. The fracture in the inter-substrate bond structure debonds the first substrate from the second substrate while leaving a first portion of the inter-substrate bond structure attached to the first substrate.

In one or more embodiments, the method includes forming an inner bond layer between the adhesion layer and the outer gas-permeable layer. The inner bond layer is configured to form a subsequent thermocompression bond after the outer bond layer and the outer gas-permeable layer are removed from the inter-substrate bond structure.

In one or more embodiments, the method includes forming an intermediate gas-permeable layer between the outer gas-permeable layer and the inner bond layer. The intermediate gas-permeable layer is configured to expand and create another fracture in the inter-substrate bond structure in response to another absorption of the gas. The intermediate gas-permeable layer absorbs the gas at an intermediate rate. The outer gas-permeable layer absorbs the gas at an outer rate. The intermediate rate is slower than the outer rate. The method further includes forming an intermediate bond layer between the outer gas-permeable layer and the intermediate gas-permeable layer. The intermediate bond layer is configured to form another thermocompression bond after the outer bond layer and the outer gas-permeable layer are removed from the inter-substrate bond structure.

In one or more embodiments, the method includes forming an intermediate gateway layer adjoining the intermediate gas-permeable layer. The intermediate gateway layer is configured to transfer the gas from an atmosphere around the inter-substrate bond structure into the intermediate gas-permeable layer.

In one or more embodiments, the method includes forming an outer gateway layer adjoining the outer gas-permeable layer. The outer gateway layer is configured to transfer the gas from an atmosphere around the inter-substrate bond structure into the outer gas-permeable layer.

In one or more embodiments, the method includes forming an oxide coating on an exterior surface of the outer gas-permeable layer. The oxide coating blocks the gas from transferring from the atmosphere around the inter-substrate bond structure through the oxide coating and into the outer gas-permeable layer.

In one or more embodiments of the method, the fracture occurs internal to the outer gas-permeable layer, In one or more embodiments of the method, the fracture is at one or more boundaries between the mating layer and the outer bond layer, between the outer bond layer and the outer gateway layer, between the outer gateway layer and the outer gas-permeable layer, and, between the outer gas-permeable layer and the inner bond layer.

A method of reworking an inter-substrate thermocompression bond is provided herein. The method includes forming an adhesion layer of an inter-substrate bond structure on a first substrate, forming an inner bond layer coupled to the adhesion layer, and forming an outer gas-permeable layer coupled to the inner bond layer. The outer gas-permeable layer is configured to expand and create a fracture in the inter-substrate bond structure in response to an absorption of a gas. The method includes forming an outer bond layer coupled to the outer gas-permeable layer, and forming an initial thermocompression bond between the second bond layer of the first substrate and a mating layer on a second substrate in response to an applied pressure and an applied heat. The initial thermocompression bond bonds the first substrate to the second substrate with the inter-substrate bond structure. The method further includes exposing the outer gas-permeable layer to the gas to create the fracture in the inter-substrate bond structure that debonds the first substrate from the second substrate while leaving a first portion of the inter-substrate bond structure attached to the first substrate, and separating the first substrate from the second substrate.

In one or more embodiments, the method includes removing the outer gas-permeable layer from the inter-substrate bond structure, removing the outer bond layer from the mating layer, and forming a subsequent thermocompression bond between the inner bond layer of the inter-substrate bond structure and the mating layer on the second substrate in response to the applied pressure and the applied heat another time. The subsequent thermocompression bond physically attaches the first substrate to the second substrate.

In one or more embodiments, the method includes removing the outer gas-permeable layer from the inter-substrate bond structure, and forming a subsequent thermocompression bond between the inner bond layer of the inter-substrate bond structure and another mating layer on a third substrate in response to the applied pressure and the applied heat another time. The subsequent thermocompression bond physically attaches the first substrate to the third substrate.

The above features and advantages, and other features and advantages of the present disclosure are readily apparent from the following detailed description of the best modes for carrying out the disclosure when taken in connection with the accompanying drawings.

DETAILED DESCRIPTION

Embodiments of the present disclosure include a system and a method for reworkable inter-substrate thermocompression bonding. A technique is provided to release thermocompression bonds without heating the chips up to a melting point of a bond metal. A layered bump bond structure for thermocompression-bonding interconnects containing a gas-permeable layer adjoining a gas gateway layer located between two thermocompression-bond-metal layers. An outer thermocompression-bond-metal layer provides an initial thermocompression bond. After the initial thermocompression bonding, a gas may be used to perform a debonding technique. During exposure to the gas, the gateway layer allows the gas to enter the gas-permeable layer. The gas-permeable layer subsequently hydrogenates and expands. The expansion causes fractures that result in the debonding. The residual layers above the inner thermocompression-bond-metal layer are removed and the bump bond structure is ready to form a second thermocompression bond. The technique leverages fine-pitch bonding approaches with some modifications that allow "reversible attachment" for temporary assembly and/or probing applications while providing a permanent option if the "reversible attachment" remains untriggered. The technique targets the layers underlying the outer bonding layer in an electrical contact stack-up by incorporating the gateway layer and the "detachment" gas-permeable layer. The gas-permeable layer is triggerable by exposure to the gas at temperatures as low as room temperature.

Figure 1:
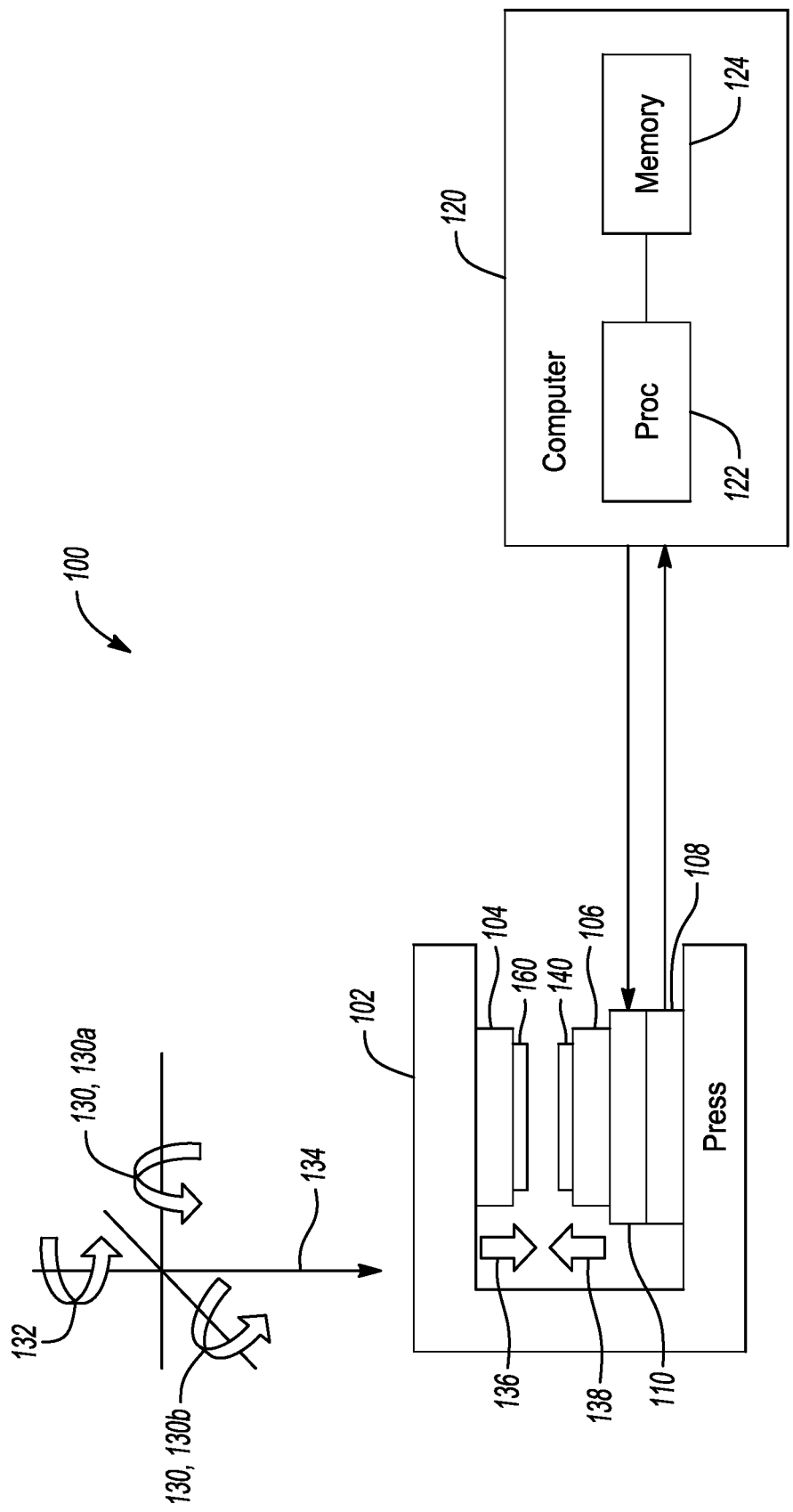
FIG. 1 is a schematic diagram of a compression system in accordance with one or more exemplary embodiments.

Referring to FIG. 1, a schematic diagram of an example implementation of a compression system 100 is shown in accordance with one or more exemplary embodiments. The compression system 100 generally includes a press 102 and a computer 120. The press 102 includes a top chuck 104, a bottom chuck 106, a load cell 108, and a heater 110. The computer 120 includes one or more processors 122 (one shown) and one or more memory devices 124 (one shown).

The press 102 implements a precision die bonder. In various embodiments, the press 102 implements a substrate-to-substrate thermocompression press. The press 102 is operational to align and press two substrates together to form inter-substrate connections. The alignment may be provided by movement of the top chuck 104 relative to the bottom chuck 106 in multiple dimensions. By way of example, the top chuck 104 may tilt 130 relative to the bottom chuck 106. The tilt 130 may include movement in a pitch direction 130a and a roll direction 130b. In some embodiments, the bottom chuck 106 may be rotatable relative to the top chuck 104 in a yaw direction 132. In other embodiments, the top chuck 104 may be rotatable relative to the bottom chuck 106 in the yaw direction 132. The top chuck 104 is also moveable relative to the bottom chuck 106 in a vertical direction 134.

Movement of the top chuck 104 downward along the vertical direction 134 presses a first substrate 140 being held by the bottom chuck 106 against a second substrate 160 being held by the top chuck 104 with an applied pressure 136 (or force). The applied pressure 136 compresses inter-substrate bond structures on the first substrate 140 into corresponding pads on the second substrate 160. In some embodiments, the first substrate 140 may be held by the top chuck 104 and the second substrate 160 may be held by the bottom chuck 106. The load cell 108 measures the applied pressure 136 being applied between the first substrate 140 and the second substrate 160.

The top chuck 104 and the bottom chuck 106 each implement a vacuum chuck. The top chuck 104 and the bottom chuck 106 are operational to hold the second substrate 160 and the first substrate 140 during the bonding process.

The load cell 108 implements a pressure sensor. The load cell 108 is operational to detect the applied pressure 136 applied by the second substrate 160 onto the first substrate 140 during a calibration test of the press 102.

The heater 110 implements a variable heat source controlled by the computer 120. The heater 110 is operational to heat the first substrate 140 and the second substrate 160 to one or more temperatures determined by the computer 120. During a thermocompression bonding process, the heater 110 raises the temperature of the first substrate 140 and the second substrate 160 to a bonding temperature appropriate for bonding the materials used in inter-substrate bump bonds. During a debonding process, the heater 110 raises the temperature of the first substrate 140 and the second substrate 160 to a diffusion temperature suitable for a gas to diffuse into the bump bonds to cause and expansion and fracture of one or more layers within the bump bonds.

The computer 120 is coupled to the heater 110 and the load cell 108. The computer 120 implements one or more data processing computers. In embodiments with multiple computers 120, the individual computers 120 are coupled together to share data, memory space, and processing resources. The computer 120 may be operational to store the configuration data of the press 102 and execute software used to control the heater 110 and analyze the information received from the load cell 108.

The processor 122 implements one or more processors within the computer 120. The processor 122 is in communication with the memory device 124 to exchange commands and data. The processor 122 is operational to execute the software tools used to analyze the data generated by the load cell 108.

The memory device 124 implements one or more non-transitory computer readable storage devices (e.g., random access memory, read-only memory, magnetic hard drives, solid-state drives, etc.). The memory device 124 stores software programs (or tools) that are executed by the processor 122.

The thermocompression bonding process applied to the inter-substrate bond structures may be similar to conventional bump bond structure bonding processes. For example, thermocompression bonding may be performed at approximately 200 degrees Celsius (° C.) for gold and approximately 300° C. for copper and aluminum while under pressure (e.g., >40 megapascals (MPA) of bond metal area).

Figure 2:
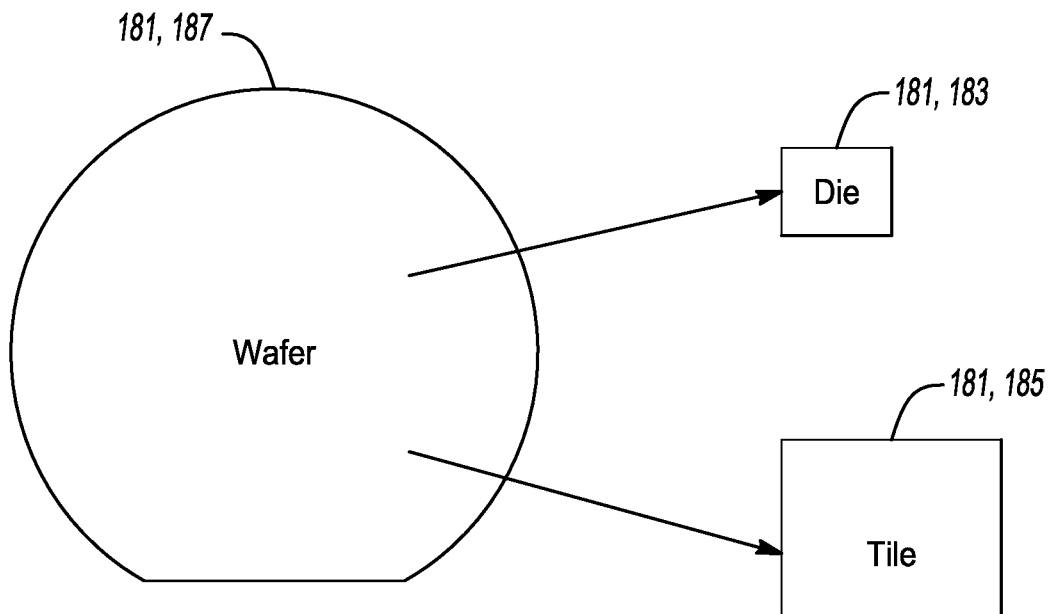
FIG. 2 is a schematic plan diagram of various substrates in accordance with one or more exemplary embodiments.

Referring to FIG. 2, a schematic plan diagram of example implementations of various substrates are shown in accordance with one or more exemplary embodiments. The substrate may be formed of a semiconductor 181. The semiconductor 181 generally includes silicon, germanium, gallium arsenide, aluminum gallium arsenide, silicon carbide, gallium nitride, indium phosphide and the like. The substrates may be in the form of a semiconductor die 183, a semiconductor tile 185, or a semiconductor wafer 187.

Figure 3:
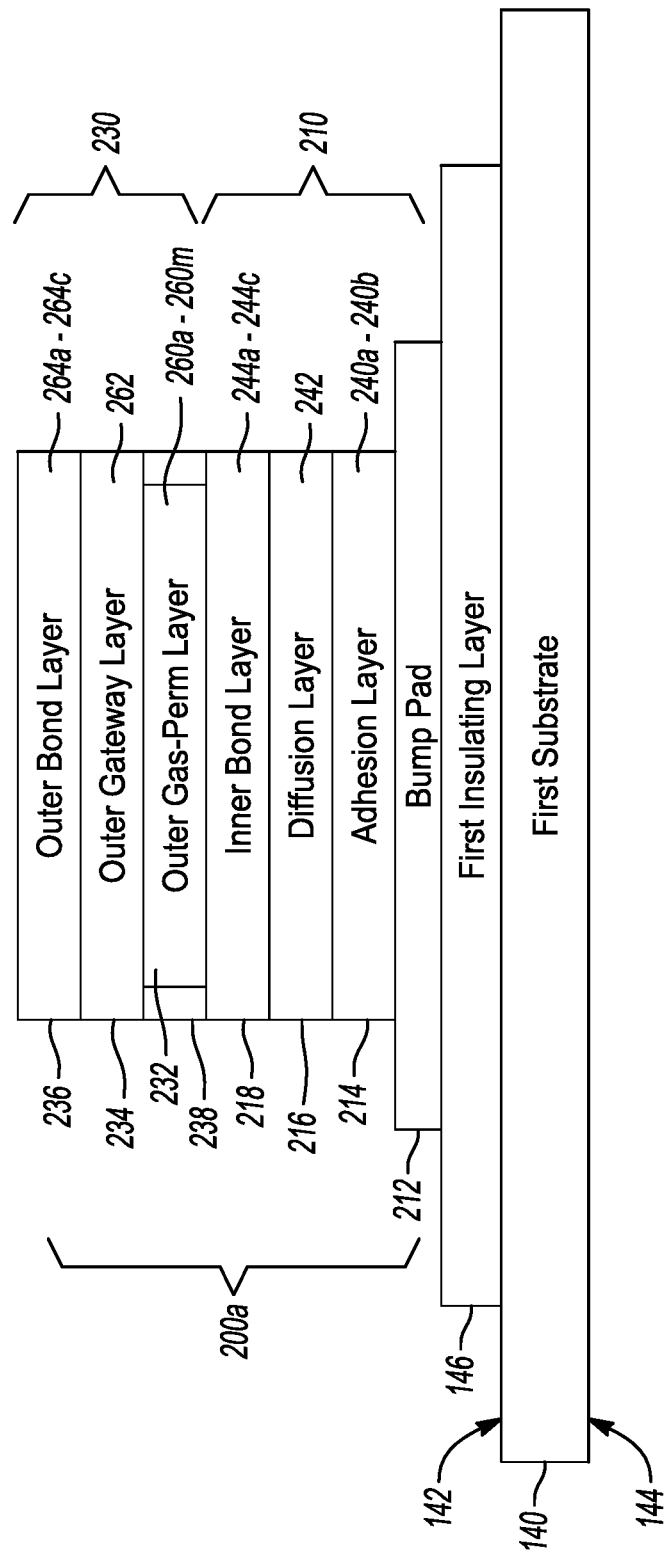
FIG. 3 is a schematic side diagram of an inter-substrate bond structure with two sets of bond layers in accordance with one or more exemplary embodiments.

Referring to FIG. 3, a schematic side diagram of an example implementation of an inter-substrate bond structure with two sets of bond layers is shown in accordance with one or more exemplary embodiments. The inter-substrate bond structure 200a illustrates a reversible contact that may be used twice. The inter-substrate bond structure 200a is formed on the first substrate 140. The first substrate 140 has a first side 142 and a third side 144 opposite the first side 142. A first insulating layer 146 may be formed on the first side 142 of the first substrate 140.

The inter-substrate bond structure 200a may be fabricated on the first insulating layer 146. The inter-substrate bond structure 200a includes an inner structure 210 and an outer structure 230. The inner structure 210 includes a bump pad 212, an adhesion layer 214, a diffusion layer 216, and an inner bond layer 218. The outer structure 230 includes an outer gas-permeable layer 232, an outer gateway layer 234, and an outer bond layer 236. An outer oxide coating 238 may be formed on an exterior surface of the outer gas-permeable layer 232.

The bump pad 212 implements a bonding pad that provides mechanical and electrical connections to the inter-substrate bond structure 200a. The bump pad 212 is operational to pass signals and/or power between circuitry (not shown) on the first substrate 140 and the second substrate 160. The bump pad 212 is generally formed of aluminum, gold, or copper. Other conductive metal layers may be used for the bump pad 212 to meet the design criteria of a particular application.

The adhesion layer 214 provides a metallurgical interface between the bump pad 212 and the rest of the inter-substrate bond structure 200a. In various embodiments, the adhesion layer 214 may be formed of titanium 240a or chromium 240b. Other metal layers may be implemented to meet the design criteria of a particular application.

The diffusion layer 216 provides a barrier between the adhesion layer 214 and the inner bond layer 218 that stops migration of metal atoms. The diffusion layer 216 is generally formed of platinum 242. Other metal layers may be implemented to meet the design criteria of a particular application.

The inner bond layer 218 provides a thermocompression-bond-metal layer formed on the diffusion layer 216. The inner bond layer 218 is a metal suitable for thermocompression bonding to another thermocompression-bond-metal layer on the second substrate 160. The metal may be formed of gold 244a, copper 244b, or aluminum 244c. Other metal layers may be implemented to meet the design criteria of a particular application.

The outer gas-permeable layer 232 provides a fracturable layer formed on the inner bond layer 218. The outer gas-permeable layer 232 is used to debond the first substrate 140 from the second substrate 160. A characteristic of the outer gas-permeable layer 232 allows for the absorption of a particular gas or gasses. The gas causes the outer gas-permeable layer 232 to expand. The expansion causes the outer gas-permeable layer 232 to fracture (or split) allowing for the debonding to occur. In various embodiments, the outer gas-permeable layer 232 is formed of titanium 260a, titanium alloy 260b, vanadium 260c, niobium 260d, palladium 260e, tantalum 260f, lanthanum 260g, yttrium 260h, zirconium 260i, scandium 260j, lithium 260k, sodium 260l, magnesium 260m, and/or alloys thereof. Other materials and/or alloys may be implemented to meet the design criteria of a particular application.

The outer gateway layer 234 provides a path for the gas to enter the outer gas-permeable layer 232 through a surface of the outer gas-permeable layer 232 normal to an axis of the inter-substrate bond structure 200a. In some embodiments, the outer gateway layer 234 may be formed of palladium 262.

The outer bond layer 236 provides another thermocompression-bond-metal layer formed on the outer gateway layer 234. The outer bond layer 236 is suitable for thermocompression bonding to another thermocompression-bond-metal layer on the second substrate 160. The outer bond layer 236 may be formed of gold 264a, copper 264b, or aluminum 264c. Other metal layers may be implemented to meet the design criteria of a particular application.

The outer oxide coating 238 may be a surface oxide formed around the outer gas-permeable layer 232. The outer oxide coating 238 generally inhibits the absorption of the particular gas that causes the fracturing to enter the outer gas-permeable layer 232 through the sidewalls of the outer gas-permeable layer 232. In the absence of the outer oxide coating 238, the outer gateway layer 234 may be made thinner or eliminated.

The gas may be hydrogen or other similar gas capable of being absorbed into the outer gas-permeable layer 232 to cause the fracturing. In various embodiments, the hydrogenation gas transforms the titanium metal of the gas-permeable layer 232 into a titanium hydride ($TiH_2$). The expansion that accompanies the hydrogenation causes the fracturing. The hydrogen gas may enter the titanium structure through the palladium of the outer gateway layer 234 that provides a hydrogen path to the titanium and serves as a secondary hydrogenation layer.

The inter-substrate bond structure 200a splits what would normally be a single bond layer into two bond layers, the outer bond layer 236 and the inner bond layer 218, separated by the outer gateway layer 234 and the outer gas-permeable layer 232. An initial thermocompression bond may be provided by outer bond layer 236. When appropriate, the outer gas-permeable layer 232 may be fractured, the inter-substrate bond structure 200a reconditioned, and the inner bond layer 218 may be used again in a second thermocompression bond. Thus, an inclusion of the titanium/palladium bilayers between the two bond-metal layers in the inter-substrate bond structure 200a and exposing the bonded structure to the hydrogen gas enables debonding of the initial thermal compressive bond.

In semiconductor wafer fabrication, the layered inter-substrate bond structure 200a and the debonding process that uses hydrogen gas under pressure to debond the second substrate 160 the first substrate 140, enables reversible substrate attachment. The outer gas-permeable layer 232 utilizes a lattice expansion and a chemical change in the metals/alloys while exposed to the hydrogen gas. Palladium is useful in the outer gateway layer 234 because palladium does not readily oxidize. In the absence of an oxide, the hydrogen gas may be absorbed (e.g., physically-absorb and/or chemically-absorbed) and passed to outer gas-permeable layer 232. Titanium that has absorbed hydrogen gas gets brittle and physically cracks. In some situations, approximately 5 atmospheres to 10 atmospheres of the hydrogen gas is sufficient to cause the cracking.

In various embodiments, the interfaces between the expanding layer and adjacent layers, like gold, may be cracked by the expansion. Modeling shows that if the expansion develops enough stress, the stress would be larger than the ultimate strength of the neighboring layers. So in the outer structure 230, with a gold layer, a palladium layer, and a titanium layer, a chemical force that causes the expansion also cracks what is generally thought to be a permanent bond between the layers. After the cracks and/or fractures have formed, the inner structure 210 may be cleaned making the inner bond layer 218 suitable to be rebonded.

Titanium metal undergoes an extensive reaction with hydrogen, including the formation of a stoichiometric $TiH_2$ phase. The $TiH_2$ phase is thermodynamically stable and therefore, near room temperature forms at low hydrogen pressures (<$10^{-6}$ atmospheres $H_2$). Thus, $TiH_2$ is thermodynamically the predominate phase for titanium in one atmosphere of hydrogen 84 at room temperature.

In addition to forming a stable hydride phase, the diffusion coefficient of hydrogen 84 in titanium is relatively high, estimated to be >$10^{-6}$ $cm^2$/second at room temperature. The diffusion coefficient enables diffusion of hydrogen over distances of 1 micrometer (um) in less than 1 second. Thus, hydrogen diffuses quickly throughout the titanium layer (<0.5 um thick) kinetically facilitating formation of the $TiH_2$.

Due to the stoichiometric composition of $TiH_2$ (i.e., 67 atomic percent hydrogen), formation of $TiH_2$ occurs with considerable expansion of the titanium atomic lattice. Given the densities and molecular weights of titanium (4.5 g/centimeters $(cm)^3$, 47.9 g/mol) and $TiH_2$ (3.9 g/$cm^3$, 49.9 g/mol), and the gram-equivalent $6.02 \times 10^{23}$ $mol^{-1}$ (Avogadro's number), an atomic volume of titanium is $1.77 \times 10^{-23}$ $cm^3$/titanium-atom in titanium metal, and $2.12 \times 10^{-23}$ $cm^3$/ titanium-atom in $TiH_2$. Thus, formation of $TiH_2$ from titanium metal involves an expansion of the titanium atomic volume by approximately 20% and, therefore, an expansion of the titanium atom (linear) spacing by approximately 6% (e.g., 1.21/3). Formation of $TiH_2$ also changes the titanium layer from a malleable condition to a brittle condition and reduces an electrical conductivity relative to Ti. Thus, the expansion upon hydride formation and transition from malleable to brittle, together with the titanium layer initially being laterally confined by the inner bond layer 218 below and the outer gateway layer 234 above, causes cracking (transforming) in a $Ti/TiH_2$ layer at the titanium/metal bond interface, and at the titanium/palladium layer interface. The cracking enables the bonded substrates to be separated.

Although having a stable hydride phase facilitates hydride formation and fracture of the titanium in the outer gas-permeable layer 232, hydrogen typically does not enter the titanium through the exposed edges of the titanium layer because of the native outer oxide coating 238 on the surface of titanium acts as a diffusion barrier. (The native oxide layer also gives the titanium a high resistance to corrosion). Therefore, the palladium in the outer gateway layer 234 provides a gateway for hydrogen gas to enter the titanium. Unlike titanium, the palladium has a relatively unstable surface oxide that is readily permeable to (or electrochemically reduced by) hydrogen. The permeability enables gaseous hydrogen ($H_2$) to dissociate into atomic hydrogen on the palladium surface at the exposed edges of the outer gateway layer 234 and for the atomic hydrogen to diffuse into the outer gateway layer 234.

Palladium also has a relatively high diffusion coefficient for hydrogen and thus the hydrogen diffuses throughout the palladium layer. At the palladium/titanium interface, hydrogen atoms may diffuse from the palladium layer into the titanium layer because the palladium/titanium atomic interface, formed by immediately sequential deposition of the palladium over the titanium, does not contain a blocking oxide. Palladium also forms a hydride at relatively low pressures of approximately 1 bar at room temperature. The palladium hydride has a composition of approximately $PdH_{0.66}$. Because of the relatively low H/Pd ratio, palladium hydride retains the metallic character of palladium metal, although with increased electrical resistance.

Formation of palladium hydride is also accompanied by an increase in the palladium atomic volume, with an increased lattice parameter of approximately 3.3%. The expansion strains the palladium layer yet may not lead to fracture within the layer due to plastic deformation of the metallic hydride phase. However, the interfaces with the underlying titanium layer and the overlying metal-bond layer may fracture due to the expansion induced stresses. Due to the moderate stability of palladium hydride, the hydride may be decomposed (dehydrogenated) back to palladium metal by removing the hydrogen pressure. The reversibility at room temperature enables cycles of palladium metal to palladium hydride and back to palladium metal that may facilitate interfacial fractures. Although chosen as a gateway for hydrogen, some instances the gateway function of the palladium layer may be disabled (or poisoned) to prevent unintentional or unwanted debonding and/or to ensure long-term stable bonding. The exposed edges of the palladium layer may be poisoned by forming a sulfide layer on the palladium surface. The sulfide layer is formed by exposure to sulfur sources, such as sulfur vapor ($S_8$), hydrogen sulfide ($H_2S$), and/or organic thiols (e.g., R—SH, where R is an alkyl group). Selenium or tellurium may also be used to block the hydrogen diffusion.

Lateral dimensions of the inter-substrate bond structures may be similar to the dimensions used in conventional bond pad structures. For example, a 5 um×5 um fine-pitch (10 um) array may be implemented for the inter-substrate bonding. Thicknesses of the adhesion layer 214, the diffusion layer 216, the inner bond layer 218, and the outer bond layer 236 may be similar to those in conventional bond pad structures. A thickness of the outer gas-permeable layer 232 may be a suitable thickness that upon exposure to an appropriate pressure of hydrogen results in fracturing sufficient to debond. The thicknesses of the outer gas-permeable layer 232 are generally in a range of approximately 5 nanometers (nm) to approximately 500 nm, approximately 50 nm to approximately 300 nm, or approximately 150 nm. A thickness of the outer gateway layer 234 may be a suitable thickness that enables the outer gateway layer 234 to serve as a gateway for hydrogen gas into the outer gas-permeable layer 232 layer through an outer gas-permeable layer 232/outer gateway layer 234 interface. The thickness of the outer gateway layer 234 generally ranges from approximately 25 nm (nanometers) to approximately 500 nm, approximately 100 nm to approximately 300 nm, or approximately 150 nm.

Figure 4:
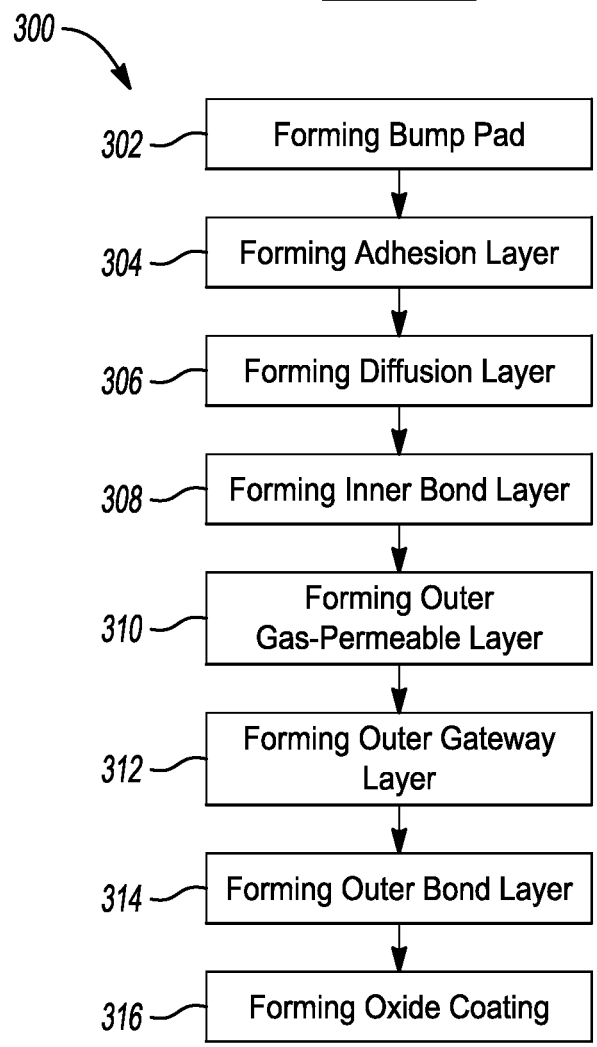
FIG. 4 is a flow diagram of a method of forming the two-bond-layer inter-substrate bond structure in accordance with one or more exemplary embodiments.

Referring to FIG. 4 a flow diagram of an example method 300 of forming the two-bond-layer inter-substrate bond structure 200a is shown in accordance with one or more exemplary embodiments. The method (or process) 300 may be implemented using standard semiconductor fabricating techniques. The method 300 includes steps 302 to 316, as illustrated. The sequence of steps is shown as a representative example. Other step orders may be implemented to meet the criteria of a particular application. While fabrication of a single inter-substrate bond structure 200a (FIG. 3) is shown, an array of many inter-substrate bond structures 200a may be fabricated concurrently.

Referring to FIGS. 3 and 4, in the step 302, the bump pad 212 is formed by depositing and patterning a metal layer on the first insulating layer 146. The adhesion layer 214 is formed on the bump pad 212 in the step 304. The diffusion layer 216 is formed on the adhesion layer 214 in the step 306 by depositing an adhesion metal.

In the step 308, the inner bond layer 218 is formed on the diffusion layer 216 by depositing the bond metal. The outer gas-permeable layer 232 is formed on the inner bond layer 218 in the step 310. The outer gateway layer 234 is formed in the step 312 on the outer gas-permeable layer 232.

In the step 314, the outer bond layer 236 is formed on the outer gateway layer 234 by depositing another bond metal. The outer oxide coating 238 on the outer gas-permeable layer 232 may be formed in the step 316 by exposing the inter-substrate bond structure 200a to oxygen.

Figure 5:
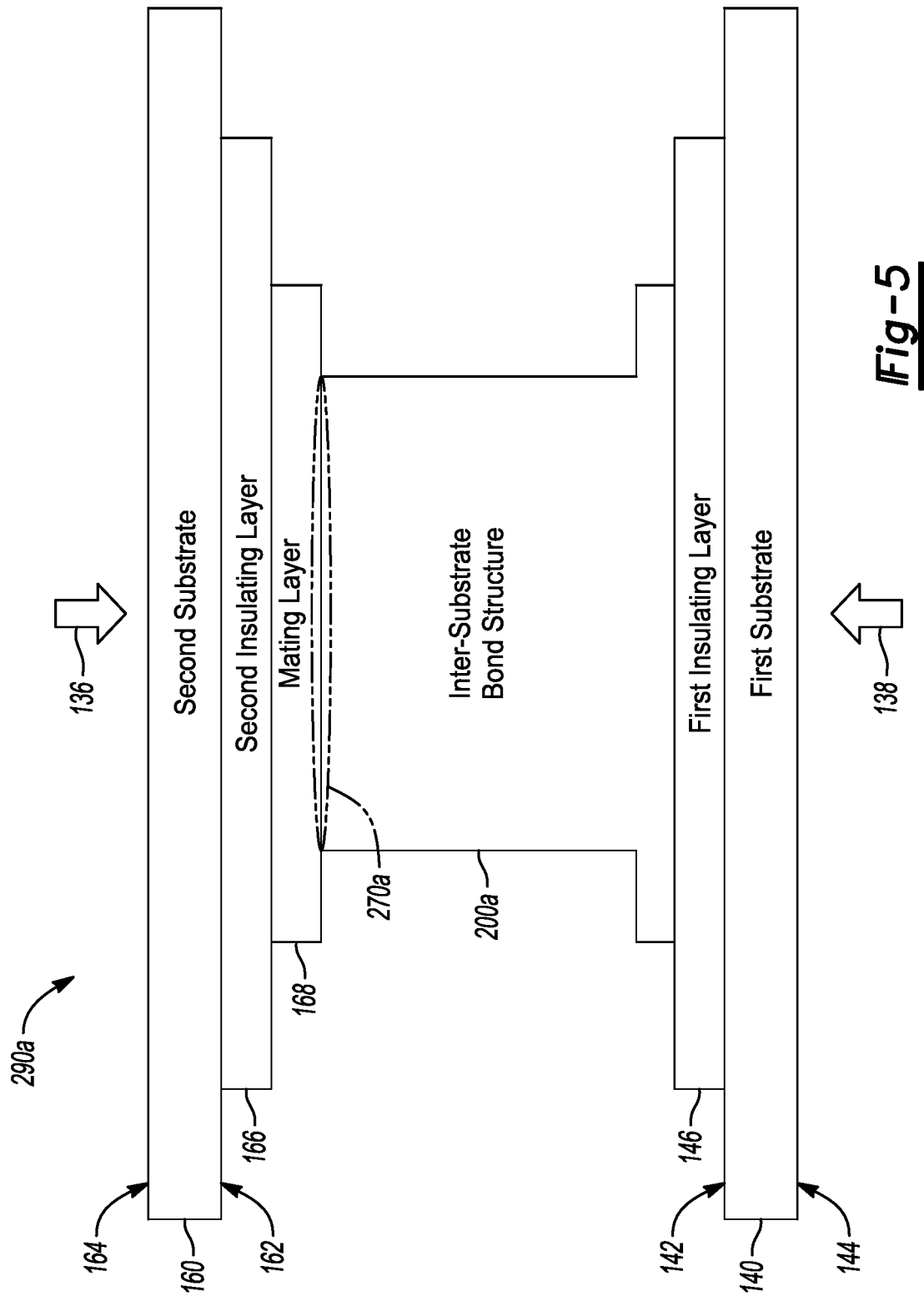
FIG. 5 is a schematic side diagram of a first bonded part in accordance with one or more exemplary embodiments.

Referring to FIG. 5, a schematic side diagram of an example implementation of a first bonded part 290a is shown in accordance with one or more exemplary embodiments. The first bonded part 290a may incorporate the two-bond-layer inter-substrate bond structure 200a.

The first bonded part 290a includes the first substrate 140, the inter-substrate bond structure 200a, and the second substrate 160. The first substrate 140 includes the first side 142, the third side 144, and the inter-substrate bond structure 200a. The second substrate 160 includes a second side 162, a fourth surface 164, a second insulating layer 166, and a mating layer 168. The fourth surface 164 is on an opposite side of the second substrate 160 as the second side 162. The second insulating layer 166 is formed on the second side 162. The mating layer 168 is formed on the second insulating layer 166.

The inter-substrate bond structure 200a is aligned with, and in physical contact with the mating layer 168. The applied pressure 136 and the applied heat 138, provided by the press 102, create an initial thermocompression bond 270a between the inter-substrate bond structure 200a and the mating layer 168. The initial thermocompression bond 270a physically attaches and electrically connects the first substrate 140 to the second substrate 160.

Figure 6:
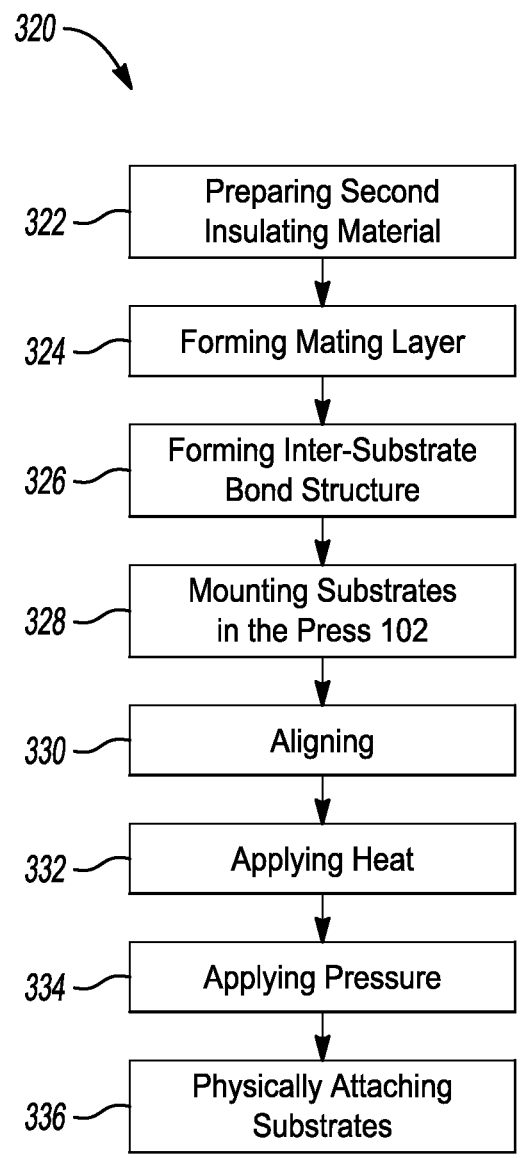
FIG. 6 is a flow diagram of a method to fabricate the first bonded part in accordance with one or more exemplary embodiments.

Referring to FIG. 6, a flow diagram of an example method 320 to fabricate the first bonded part 290a is shown in accordance with one or more exemplary embodiments. The method (or process) 320 may be implemented using standard semiconductor fabricating techniques. The method 320 includes steps 322 to 336, as illustrated. The sequence of steps is shown as a representative example. Other step orders may be implemented to meet the criteria of a particular application.

Referring to FIGS. 1, 5 and 6, in the step 322, the second insulating layer 166 on the second side 162 of second substrate 160 is prepared to receive the mating layer 168. The mating layer 168 is formed on second insulating layer 166 in the step 324. The inter-substrate bond structure 200a may be formed on the first substrate 140 in the step 326 (e.g., the method 300 in FIG. 4).

In the step 328, the first substrate 140 and the second substrate 160 are mounted in the press 102 and aligned in the step 330. The applied heat 138 may be generated in the step 332 to warm the first substrate 140 and the second substrate 160. The applied pressure 136 between the first substrate 140 and the second substrate 160 may be generated in the step 334 to form the initial thermocompression bond 270a. The initial thermocompression bond 270a physically and electrically attaches the first substrate 140 to the second substrate 160 to form the first bonded part 290a in the step 336. The first bonded part 290a is subsequently tested for proper communication between the first substrate 140 and the second substrate 160, and overall operations of the resulting circuitry.

Figure 7:
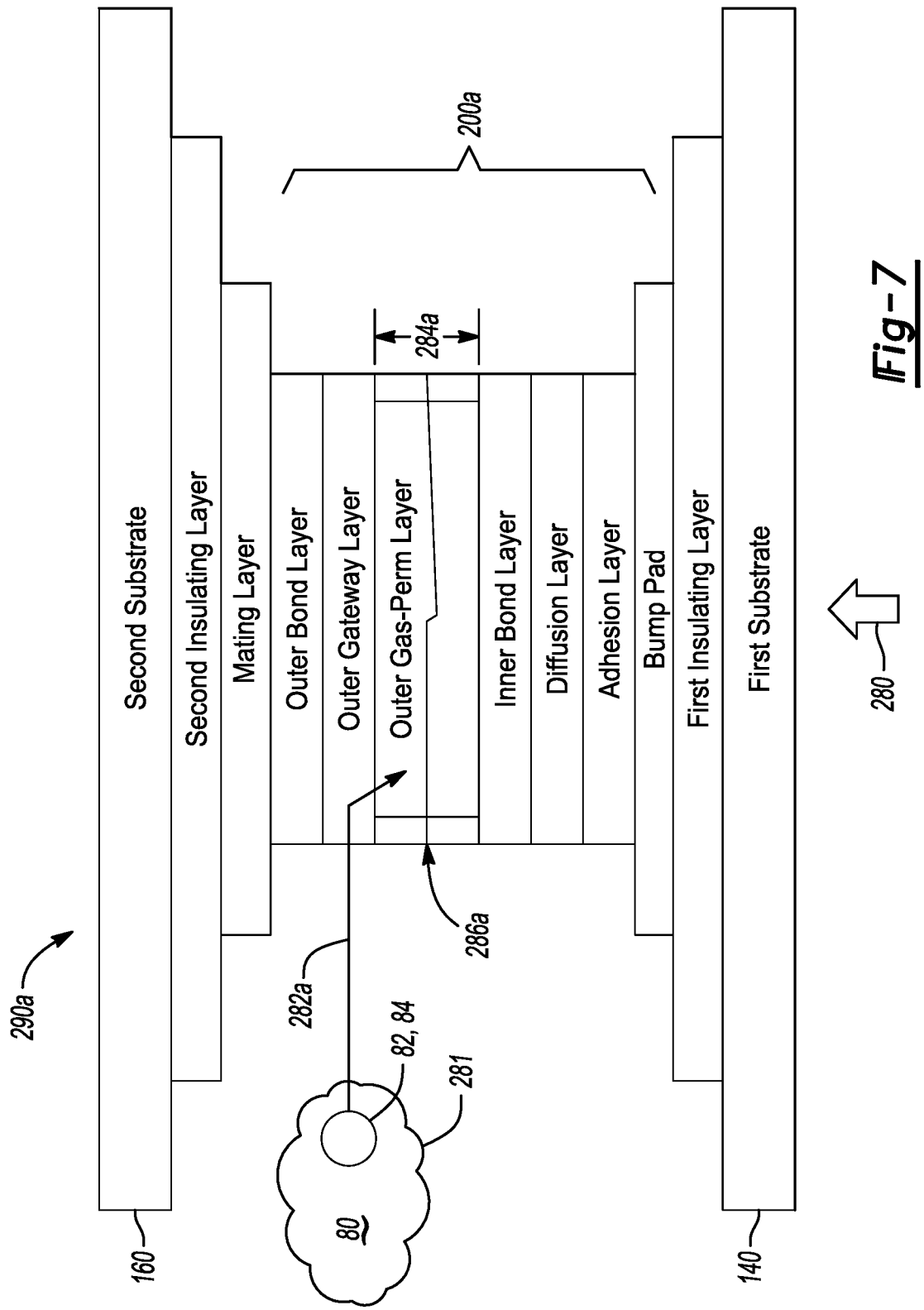
FIG. 7 is a schematic side diagram of the first bonded part being fractured in accordance with one or more exemplary embodiments.

Referring to FIG. 7, a schematic side diagram of an example first bonded part 290a being fractured is shown in accordance with one or more exemplary embodiments. The first bonded part 290a is fractured by exposure to a gas 82 within an atmosphere 80 at a given pressure 281 and heated to a given temperature 280. The gas 82 (e.g., hydrogen 84) diffuses at an outer rate 282a from the atmosphere 80 into the outer gas-permeable layer 232 via the outer gateway layer 234. The gas 82 causes the outer gas-permeable layer 232 to hydrogenate and expand 284a. The expansion 284a causes one or more fractures 286a (or cracks) in the outer gas-permeable layer 232. The fractures 286a permit the first substrate 140 and the second substrate 160 to be physically separated from each other.

Figure 8:
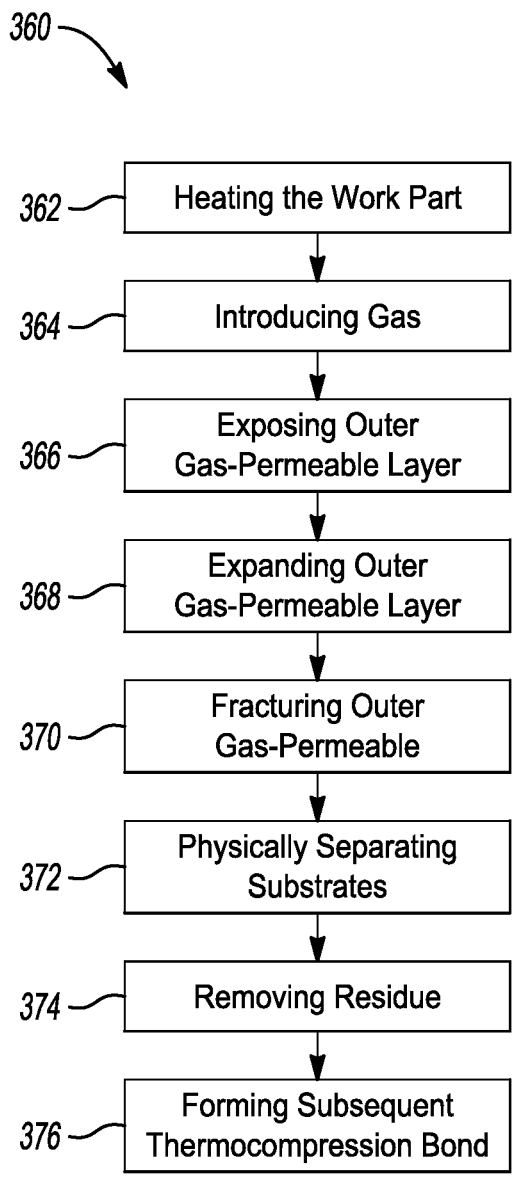
FIG. 8 is a flow diagram of a method for debonding the first bonded part in accordance with one or more exemplary embodiments.

Referring to FIG. 8, a flow diagram of an example method 360 for debonding the first bonded part 290a is shown in accordance with one or more exemplary embodiments. The method (or process) 360 may be carried out using standard semiconductor fabrication techniques. The method 360 includes steps 362 to 376, as illustrated. The sequence of steps is shown as a representative example. Other step orders may be implemented to meet the criteria of a particular application.

Referring to FIGS. 7 and 8, after thermocompression bonding of the first substrate 140 to the second substrate 160, debonding is performed by heating the first bonded part 290a to the given temperature 280 in the step 362. In the step 364, the gas 82 is introduced into the atmosphere 80 around the first bonded part 290a. The inter-substrate bond structure 200a is exposed to the applied pressure 281 of hydrogen 84 for an appropriate amount of time (e.g., 3 to 5 hours) in the step 366, after which the applied pressure 281 of the hydrogen 84 is released. In the step 368, the outer gas-permeable layer 232 expands due to the penetration of the hydrogen 84. The expansion 284a causes fracturing in the inter-substrate bond structure 200a in the step 370. The first substrate 140 and the second substrate 160 are physically (e.g., mechanically) separated in the step 372. Thereafter, the fragments of the inter-substrate bond structure 200a may be removed in the step 374 for reuse in forming a subsequent thermocompression bond in the step 376.

Referring again to FIG. 3, the hydrogen gas is used for the debonding because the hydrogen gas dissociates on the exposed edges of the palladium in the outer gateway layer 234, and atomic hydrogen diffuses throughout the palladium forming a metallic palladium-hydride phase. At the titanium/palladium interface, the palladium provides a gateway for hydrogen into the titanium of the outer gas-permeable layer 232. Thus, the hydrogen diffuses from the palladium into the titanium and hydrogenates the titanium forming an insulating $TiH_2$ phase. The atomic level lattice expansion that occurs upon formation of the $TiH_2$ results in stresses that fracture the $TiH_2$ layer and/or the interfaces with the overlying palladium and/or the underlying bond metal in the inner bond layer 218. In addition, the lateral expansion that occurs in the palladium upon metallic palladium-hydride formation may result in stresses that fracture the palladium/outer bond layer interface. Together, the fractures enable separation of the bonded substrates 140 and 160. Selective etching removes residual titanium and/or $TiH_2$, leaving the initially underlying inner bond layer 218 exposed with a clean surface that may be thermocompression bonded in a subsequent cycle. Inter-substrate bond structures containing multiple titanium alloy/palladium/bond metal layers each with a different titanium alloy, with different hydrogenation pressures, may be used to enable multiple bonding/debonding cycles.

Figure 9:
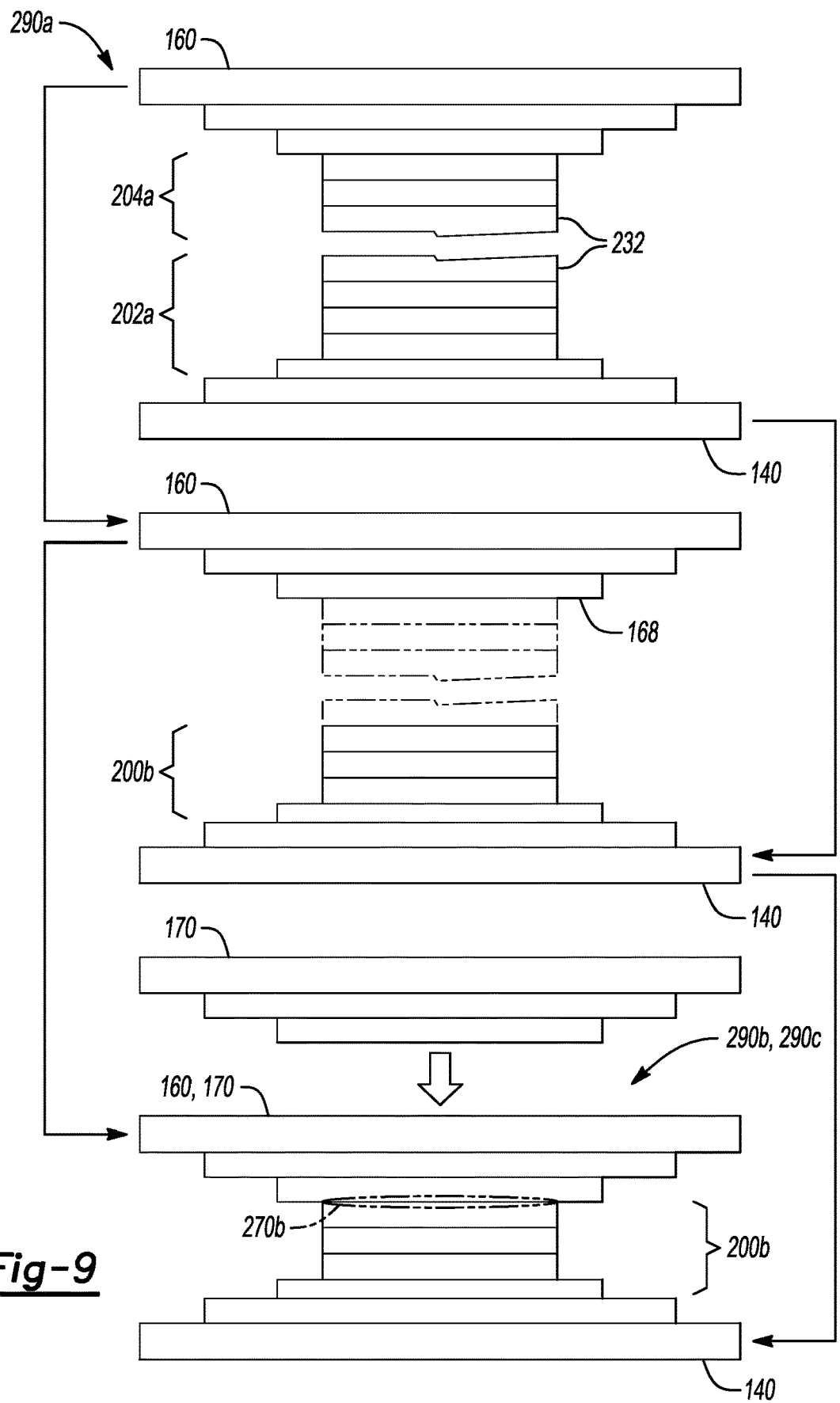
FIG. 9 is a schematic diagram illustrating a rework of the first bonded part into a second bonded part or a third bonded part in accordance with one or more exemplary embodiments.

Referring to FIG. 9, a schematic diagram illustrating an example rework of the first bonded part 290a into a second bonded part 290b or a third bonded part 290c is shown in accordance with one or more exemplary embodiments. After fracturing (top of the figure), the inter-substrate bonding structure 200a (FIG. 7) may be divided into a first portion 202a and a second portion 204a. In the example, the inter-substrate bond structure 200a is broken within the outer gas-permeable layer 232. The first portion 202a remains attached to the first substrate 140. The second portion 204a remains attached to the second substrate 160.

The first portion 202a may include residual $TiH_2$ and/or unreacted titanium that are removed by selective etches, such as Transene Titanium Etchants TFT or TFTN (center of the figure). The etching leaves a shortened inter-substrate bond structure 200b with a clean inner bond layer suitable for a subsequent cycle of bonding. The residue on the second substrate 160 may also be etched to leave a clean mating layer 168.

In various embodiments, the cleaned first substrate 140 and the cleaned second substrate 160 may be rebonded with a subsequent thermocompression bond 270b to create a second bonded part 290b with the shortened inter-substrate bond structure 200b (bottom of the figure). In other embodiments, a third substrate 170 may be bonded to the cleaned first substrate 140 with the subsequent thermocompression bond 270b to create a third bonded part 290c also with the shortened inter-substrate bond structure 200b.

Figure 10:
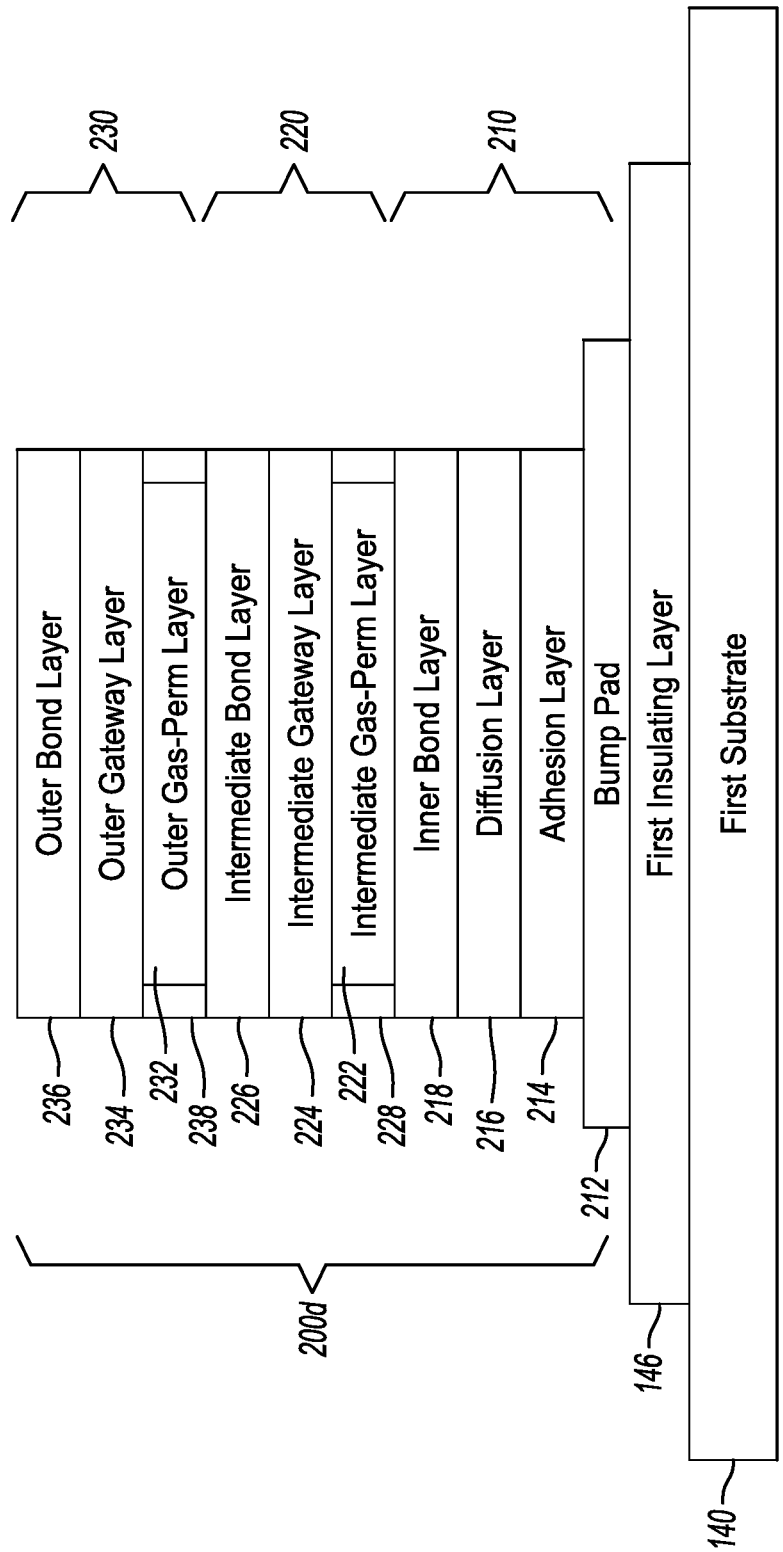
FIG. 10 is a schematic side diagram of an inter-substrate bond structure with three sets of bond layers in accordance with one or more exemplary embodiments.

Referring to FIG. 10, a schematic side diagram of an example implementation of an inter-substrate bond structure with three sets of bond layers is shown in accordance with one or more exemplary embodiments. The inter-substrate bond structure 200d illustrates a reversible contact that may be used three times. The inter-substrate bond structure 200d is formed on the first substrate 140. The inter-substrate bond structure 200d includes the inner structure 210, an intermediate structure 220, and the outer structure 230.

The inner structure 210 and the outer structure 230 are the same as shown in FIG. 3. The intermediate structure 220 is similar to the outer structure 230, but is disposed between the inner structure 210 and the outer structure 230. The intermediate structure 220 includes an intermediate gas-permeable layer 222, an intermediate gateway layer 224, an intermediate bond layer 226, and an intermediate oxide coating 228.

The intermediate gas-permeable layer 222 is formed on the inner bond layer 218 and is similar to the outer gas-permeable layer 232. The intermediate gas-permeable layer 222 is generally fabricated with an alloy that absorbs the hydrogen gas at a slower rate than the outer gas-permeable layer 232.

The intermediate gateway layer 224 is formed on the intermediate gas-permeable layer 222 and is similar to the outer gateway layer 234.

The intermediate bond layer 226 is formed on the intermediate gateway layer 224 and is similar to the outer bond layer 236.

The intermediate oxide coating 228 is formed on an exterior surface of the intermediate gas-permeable layer 222, and is similar to the outer oxide coating 238 on the outer gas-permeable layer 232.

Figure 11:
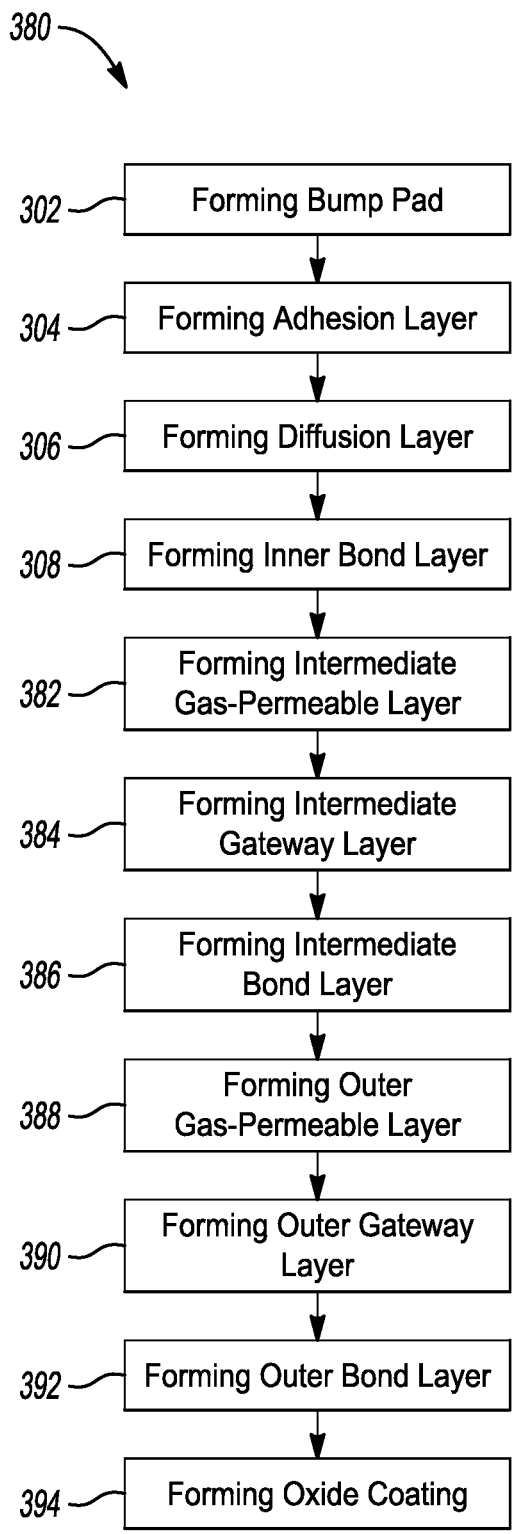
FIG. 11 is a flow diagram of a method of forming the three-bond-layer inter-substrate bond structure in accordance with one or more exemplary embodiments

Referring to FIG. 11, a flow diagram of an example method 380 of forming the three-bond-layer inter-substrate bond structure 200d is shown in accordance with one or more exemplary embodiments. The method (or process) 380 may be implemented using standard semiconductor fabricating techniques. The method 380 includes steps 302 to 308 and 382 to 394, as illustrated. The sequence of steps is shown as a representative example. Other step orders may be implemented to meet the criteria of a particular application. While fabrication of a single inter-substrate bond structure 200d is shown, an array of many inter-substrate bond structures 200d may be fabricated concurrently.

Referring to FIGS. 10 and 11, in the step 302, the bump pad 212 is formed by depositing and patterning a metal layer on the first insulating layer 146. The adhesion layer 214 is formed on the bump pad 212 in the step 304. The diffusion layer 216 is formed on the adhesion layer 214 in the step 306 by depositing an adhesion metal. In the step 308, the inner bond layer 218 is formed on the diffusion layer 216 by depositing the bond metal.

The intermediate gas-permeable layer 222 is formed on the inner bond layer 218 in the step 382. The intermediate gateway layer 224 is formed in the step 384 on the intermediate gas-permeable layer 222. In the step 386, the intermediate bond layer 226 is formed on the intermediate gateway layer 224 by depositing another bond metal.

In the step 388, the outer gas-permeable layer 232 is formed on the intermediate bond layer 226. The outer gateway layer 234 is formed on the outer gas-permeable layer 232 in the step 390. In the step 392, the outer bond layer 236 is formed on the outer gateway layer 234. The intermediate oxide coating 228 on the intermediate gas-permeable layer 222, and the outer oxide coating 238 on the outer gas-permeable layer 232 may be formed in the step 394 by exposing the inter-substrate bond structure 200d to oxygen.

Figure 12:
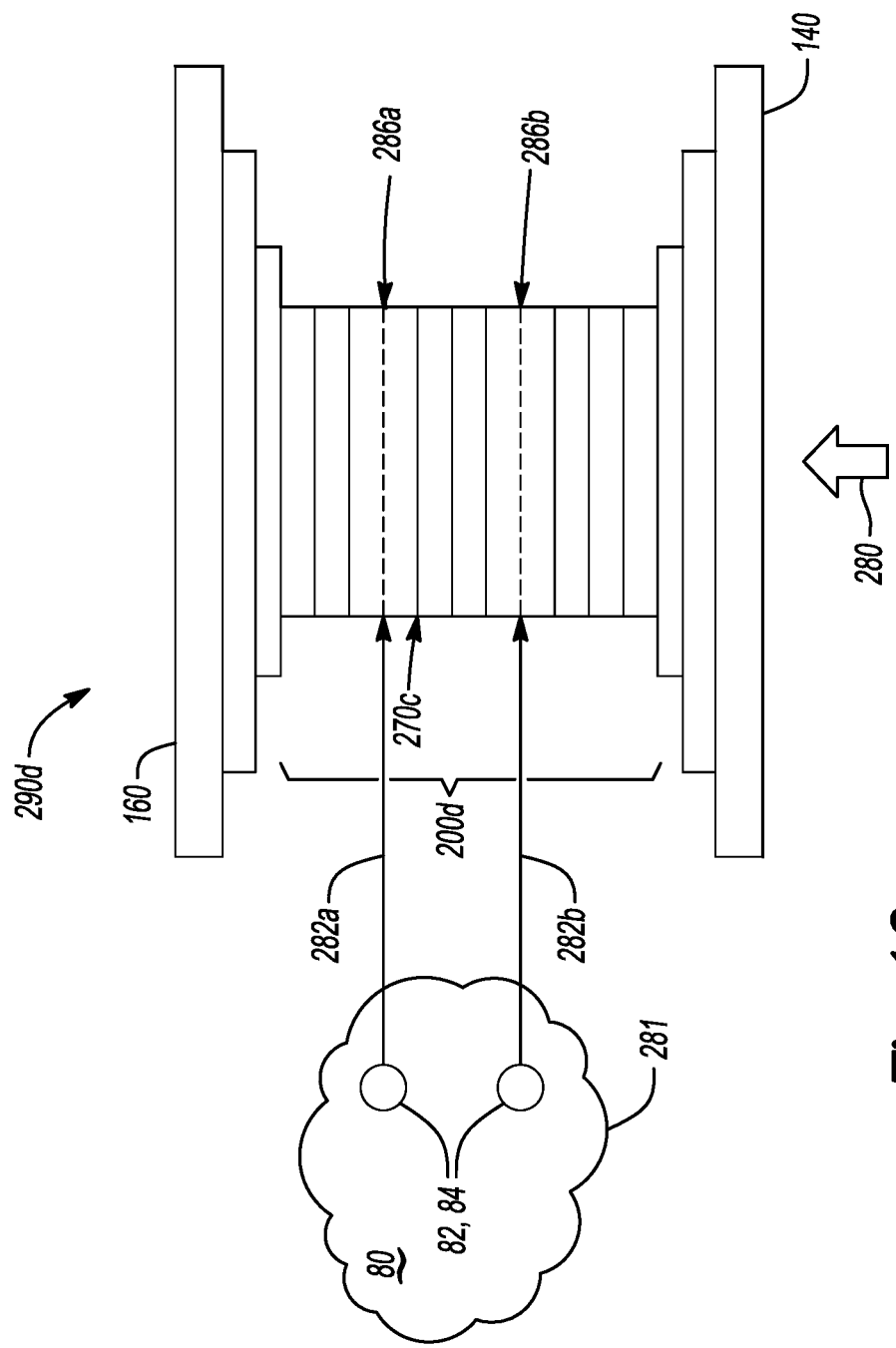
FIG. 12 is a schematic side diagram of a fourth bonded part being fractured in accordance with one or more exemplary embodiments.

Referring to FIG. 12, a schematic side diagram of an example fourth bonded part 290d being fractured is shown in accordance with one or more exemplary embodiments. The fourth bonded part 290d is fractured by exposure to the gas 82 within the atmosphere 80 at the given pressure 281 and heated to the given temperature 280. The gas 82 diffuses from the atmosphere 80 into the outer gas-permeable layer 232 (FIG. 10) via the outer gateway layer 234 at an outer rate 282a, and into the intermediate gas-permeable layer 222 via the intermediate gateway layer 224 at an intermediate rate 282b. The intermediate rate 282b is slower than the outer rate 282a. The gas 82 causes the outer gas-permeable layer 232 to hydrogenate and expand. The expansion of the outer gas-permeable layer 232 causes one or more fractures 286a (or cracks) in the outer gas-permeable layer 232. The fractures 286a permit the first substrate 140 and the second substrate 160 to be physically separated from each other. The gas 82 also causes the intermediate gas-permeable layer 222 to hydrogenate, but at a slower rate than the outer gas-permeable layer 232. Therefore, the intermediate gas-permeable layer 222 has not fractured 286b at the point where the outer gas-permeable layer 232 has fractured 286a.

Use of a titanium/palladium bilayer between the two bond layers in the two-bond-layer inter-substrate bond structure 200a (FIG. 3) enables a single cycle of debonding. Two or more cycles of debonding may be achieved with bond pad structures containing multiple titanium alloy/palladium bilayers where the final bilayer contains titanium metal, and the earlier bilayers contain titanium alloys with increasing equilibrium hydrogenation pressures. Varying the alloys in the gas-permeable layers enables the outer gas-permeable bilayer to fracture and the overlying second substrate 160 to be debonded at a low hydrogen pressure, while lower gas-permeable layers remain in metallic and electrically conducting states. After rebonding the second substrate 160 or bonding with the third substrate 170, exposure to higher hydrogen pressures may be used hydrogenate and fracture the next lower (e.g., next closer to the first substrate 140) titanium alloy/palladium bilayer in a subsequent cycle.

The titanium metal hydrogenates at low pressures at a near room temperature. Therefore, a moderate predetermined hydrogen pressure of approximately 1 atmosphere is sufficient for formation of the $TiH_2$. For higher equilibrium hydrogen pressures, the titanium alloys may be used. For example, alloys of vanadium, titanium, and chromium form approximately stoichiometric hydrides with equilibrium hydrogen pressures that vary continuously with composition. In particular, hydrogen absorption at 273 Kelvin (K) (0° C.) occurs at 0.5 atmospheres for $V_{0.80}Ti_{0.08}Cr_{0.12}$, at 3 atmospheres for $V_{0.80}Ti_{0.05}Cr_{0.15}$, and at 10 atmospheres for $V_{0.80}Ti_{0.03}Cr_{0.17}$. Adjusting to room temperature (approximately 22° C., and an increase in pressure of approximately 2.5×) gives estimated hydrogenation pressures of 1.25 atmospheres for $V_{0.80}Ti_{0.08}Cr_{0.12}$, at 7.5 atmospheres for $V_{0.80}Ti_{0.05}Cr_{0.15}$, and at 25 atmospheres for $V_{0.80}Ti_{0.03}Cr_{0.17}$. Thus, using a layered bond structure, such as base-layers/Au/$V_{0.80}Ti_{0.03}Cr_{0.17}$/Pd/Au/$V_{0.80}Ti_{0.05}Cr_{0.15}$/Pd/Au/Ti/Pd/Au, may be bonded three times reversibly and a fourth final time. After a first bonding to the top gold layer, a hydrogen pressure of approximately 1 atmosphere would hydrogenate the titanium layer, but be too low to hydrogenate either of the underlying titanium alloy layers. After an initial removal of the second substrate 160 and a second bonding, a pressure of 10 atmospheres would hydrogenate the $V_{0.80}Ti_{0.05}Cr_{0.15}$ layer but be too low to hydrogenate the $V_{0.80}Ti_{0.03}Cr_{0.17}$ layer. After another removal of the mated substrate and a third bonding, a pressure of 30 atmospheres would hydrogenate the $V_{0.80}Ti_{0.03}Cr_{0.17}$ layer enabling a third debonding and a fourth and final bonding. Although pressures from 1 to 30 atmospheres may be applied, finer compositional variations may be used to reduce the range of applied pressures.

This disclosure is susceptible of embodiments in many different forms. Representative embodiments of the disclosure are shown in the drawings and will herein be described in detail with the understanding that these embodiments are provided as an exemplification of the disclosed principles, not limitations of the broad aspects of the disclosure. To that extent, elements and limitations that are described, for example, in the Abstract, Background, Summary, and Detailed Description sections, but not explicitly set forth in the claims, should not be incorporated into the claims, singly or collectively, by implication, inference or otherwise.

For purposes of the present detailed description, unless specifically disclaimed, the singular includes the plural and vice versa. The words "and" and "or" shall be both conjunctive and disjunctive. The words "any" and "all" shall both mean "any and all", and the words "including," "containing," "comprising," "having," and the like shall each mean "including without limitation." Moreover, words of approximation such as "about," "almost," "substantially," "approximately," and "generally," may be used herein in the sense of "at, near, or nearly at," or "within 0-5% of," or "within acceptable manufacturing tolerances," or other logical combinations thereof. Referring to the drawings, wherein like reference numbers refer to like components.

The detailed description and the drawings or FIGS. are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment may be combined with one or a plurality of other desired characteristics from other embodiments, resulting in other embodiments not described in words or by reference to the drawings. Accordingly, such other embodiments fall within the framework of the scope of the appended claims.

What is claimed is:

1. An inter-substrate bond structure comprising:
   an adhesion layer configured to attach the inter-substrate bond structure to a first substrate;
   an outer gas-permeable layer coupled to the adhesion layer, wherein the outer gas-permeable layer is configured to expand and create a fracture in the inter-substrate bond structure in response to an absorption of a gas; and
   an outer bond layer coupled to the outer gas-permeable layer, wherein the outer bond layer is configured to form an initial thermocompression bond with a mating layer on a second substrate in response to an applied pressure and an applied heat,
   wherein the initial thermocompression bond bonds the first substrate to the second substrate with the inter-substrate bond structure, and the fracture in the inter-substrate bond structure debonds the first substrate from the second substrate while leaving a first portion of the inter-substrate bond structure attached to the first substrate.

2. The inter-substrate bond structure according to claim 1, further comprising:
   an inner bond layer disposed between the adhesion layer and the outer gas-permeable layer, wherein the inner bond layer is configured to form a subsequent thermocompression bond after the outer bond layer and the outer gas-permeable layer are removed from the inter-substrate bond structure.

3. The inter-substrate bond structure according to claim 2, further comprising:
   an intermediate gas-permeable layer disposed between the outer gas-permeable layer and the inner bond layer, wherein the intermediate gas-permeable layer is configured to expand and create another fracture in the inter-substrate bond structure in response to another absorption of the gas, and the intermediate gas-permeable layer absorbs the gas at an intermediate rate, the outer gas-permeable layer absorbs the gas at an outer rate, and the intermediate rate is slower than the outer rate; and
   an intermediate bond layer disposed between the outer gas-permeable layer and the intermediate gas-permeable layer, wherein the intermediate bond layer is configured to form another thermocompression bond after the outer bond layer and the outer gas-permeable layer are removed from the inter-substrate bond structure.

4. The inter-substrate bond structure according to claim 3, further comprising:
   an intermediate gateway layer adjoining the intermediate gas-permeable layer, wherein the intermediate gateway layer is configured to transfer the gas from an atmosphere around the inter-substrate bond structure into the intermediate gas-permeable layer.

5. The inter-substrate bond structure according to claim 1, further comprising:
   an outer gateway layer adjoining the outer gas-permeable layer, wherein the outer gateway layer is configured to transfer the gas from an atmosphere around the inter-substrate bond structure into the outer gas-permeable layer.

6. The inter-substrate bond structure according to claim 5, further comprising:
   an outer oxide coating formed on an exterior surface of the outer gas-permeable layer, wherein the outer oxide coating blocks the gas from transferring from the atmosphere around the inter-substrate bond structure through the outer oxide coating and into the outer gas-permeable layer.

7. The inter-substrate bond structure according to claim 6, wherein the outer gateway layer comprises palladium, and the gas comprises hydrogen.

8. The inter-substrate bond structure according to claim 1, wherein:
   the outer gas-permeable layer comprises one or more of titanium, titanium alloy, vanadium, niobium, palladium, tantalum, lanthanum, yttrium, zirconium, scandium, lithium, sodium, and magnesium; and
   the gas comprises hydrogen.

9. The inter-substrate bond structure according to claim 1, wherein the first substrate comprises one of a semiconductor die, a semiconductor tile, or a semiconductor wafer.

10. A method for fabricating an inter-substrate bond structure comprising:
   forming an adhesion layer of the inter-substrate bond structure on a first substrate;
   forming an outer gas-permeable layer coupled to the adhesion layer, wherein the outer gas-permeable layer is configured to expand and create a fracture in the inter-substrate bond structure in response to an absorption of a gas; and
   forming an outer bond layer coupled to the outer gas-permeable layer,
   wherein the outer bond layer is configured to form an initial thermocompression bond with a mating layer on a second substrate in response to an applied pressure and an applied heat, the initial thermocompression bond bonds the first substrate to the second substrate with the inter-substrate bond structure, and the fracture in the inter-substrate bond structure debonds first substrate from the second substrate while leaving a first portion of the inter-substrate bond structure attached to the first substrate.

11. The method according to claim 10, further comprising:
   forming an inner bond layer between the adhesion layer and the outer gas-permeable layer, wherein the inner bond layer is configured to form a subsequent thermocompression bond after the outer bond layer and the outer gas-permeable layer are removed from the inter-substrate bond structure.

12. The method according to claim 11, further comprising:
   forming an intermediate gas-permeable layer between the outer gas-permeable layer and the inner bond layer, wherein the intermediate gas-permeable layer is configured to expand and create another fracture in the inter-substrate bond structure in response to another absorption of the gas, the intermediate gas-permeable layer absorbs the gas at an intermediate rate, the outer gas-permeable layer absorbs the gas at an outer rate, and the intermediate rate is slower than the outer rate; and
   forming an intermediate bond layer between the outer gas-permeable layer and the intermediate gas-permeable layer, wherein the intermediate bond layer is configured to form another thermocompression bond after the outer bond layer and the outer gas-permeable layer are removed from the inter-substrate bond structure.

13. The method according to claim 12, further comprising:
   forming an intermediate gateway layer adjoining the intermediate gas-permeable layer, wherein the intermediate gateway layer is configured to transfer the gas from an atmosphere around the inter-substrate bond structure into the intermediate gas-permeable layer.

14. The method according to claim 10, further comprising:
   forming an outer gateway layer adjoining the outer gas-permeable layer, wherein the outer gateway layer is configured to transfer the gas from an atmosphere around the inter-substrate bond structure into the outer gas-permeable layer.

15. The method according to claim 14, further comprising:
   forming an oxide coating on an exterior surface of the outer gas-permeable layer, wherein the oxide coating blocks the gas from transferring from the atmosphere around the inter-substrate bond structure through the oxide coating and into the outer gas-permeable layer.

16. The method according to claim 10, wherein the fracture occurs internal to the outer gas-permeable layer.

17. The method according to claim 10, wherein the fracture is at one or more boundaries between the mating layer and the outer bond layer, between the outer bond layer and the outer gateway layer, between the outer gateway layer and the outer gas-permeable layer, and between the outer gas-permeable layer and the inner bond layer.

18. A method of reworking an inter-substrate thermocompression bond, comprising:
   forming an adhesion layer of an inter-substrate bond structure on a first substrate;
   forming an inner bond layer coupled to the adhesion layer;
   forming an outer gas-permeable layer coupled to the inner bond layer, wherein the outer gas-permeable layer is configured to expand and create a fracture in the inter-substrate bond structure in response to an absorption of a gas;
   forming an outer bond layer coupled to the outer gas-permeable layer;
   forming an initial thermocompression bond between the second bond layer of the first substrate and a mating layer on a second substrate in response to an applied pressure and an applied heat, wherein the initial thermocompression bond bonds the first substrate to the second substrate with the inter-substrate bond structure;
   exposing the outer gas-permeable layer to the gas to create the fracture in the inter-substrate bond structure that debonds the first substrate from the second substrate while leaving a first portion of the inter-substrate bond structure attached to the first substrate; and
   separating the first substrate from the second substrate.

19. The method according to claim 18, further comprising:
   removing the outer gas-permeable layer from the inter-substrate bond structure;
   removing the outer bond layer from the mating layer; and
   forming a subsequent thermocompression bond between the inner bond layer of the inter-substrate bond structure and the mating layer on the second substrate in response to the applied pressure and the applied heat another time, wherein the subsequent thermocompression bond physically attaches the first substrate to the second substrate.

20. The method according to claim 18, further comprising:
   removing the outer gas-permeable layer from the inter-substrate bond structure; and
   forming a subsequent thermocompression bond between the inner bond layer of the inter-substrate bond structure and another mating layer on a third substrate in response to the applied pressure and the applied heat another time, wherein the subsequent thermocompression bond physically attaches the first substrate to the third substrate.

* * * * *